United States Patent
Kanada et al.

(10) Patent No.: US 7,022,377 B2
(45) Date of Patent: *Apr. 4, 2006

(54) METHOD FOR PRODUCING POROUS POLYIMIDE RESIN AND POROUS POLYIMIDE RESIN

(75) Inventors: Mitsuhiro Kanada, Osaka (JP); Takahiro Fukuoka, Osaka (JP); Naotaka Kinjou, Osaka (JP)

(73) Assignee: Nitto Denko Corporation, Osaka (JP)

( * ) Notice: Subject to any disclaimer, the term of this patent is extended or adjusted under 35 U.S.C. 154(b) by 130 days.

This patent is subject to a terminal disclaimer.

(21) Appl. No.: 10/380,178

(22) PCT Filed: Jul. 10, 2002

(86) PCT No.: PCT/JP02/06991

§ 371 (c)(1),
(2), (4) Date: Mar. 13, 2003

(87) PCT Pub. No.: WO03/006542

PCT Pub. Date: Jan. 23, 2003

(65) Prior Publication Data

US 2004/0101626 A1     May 27, 2004

(30) Foreign Application Priority Data

Jul. 13, 2001   (JP) .............................. 2001-213274

(51) Int. Cl.
   *B05D 3/02*   (2006.01)
   *B05D 3/10*   (2006.01)
(52) U.S. Cl. .................... 427/243; 427/244; 427/336; 427/352; 427/379
(58) Field of Classification Search .............. 427/243, 427/244, 336, 352, 379
   See application file for complete search history.

(56) References Cited

U.S. PATENT DOCUMENTS

| | | | |
|---|---|---|---|
| 3,883,452 A * | 5/1975 | Scheuerlein et al. | 524/512 |
| 4,113,628 A * | 9/1978 | Alegranti | 210/500.23 |
| 5,510,395 A * | 4/1996 | Tomioka et al. | 521/184 |
| 5,700,844 A * | 12/1997 | Hedrick et al. | 521/77 |
| 5,726,211 A * | 3/1998 | Hedrick et al. | 521/61 |
| 5,776,990 A * | 7/1998 | Hedrick et al. | 521/77 |
| 5,804,607 A * | 9/1998 | Hedrick et al. | 521/64 |
| 6,372,808 B1 | 4/2002 | Kanada et al. | |
| 6,399,669 B1 * | 6/2002 | Suzuki et al. | 521/183 |

(Continued)

FOREIGN PATENT DOCUMENTS

JP   06-322168   * 11/1994

(Continued)

*Primary Examiner*—Erma Cameron
(74) *Attorney, Agent, or Firm*—Jean C. Edwards, Esq.; Akerman Senterfitt

(57) ABSTRACT

A method of producing porous polyimide resin that enables pores to be formed in a precursor of polyimide resin, with its form of microphase-separated structure wherein a dispersive compound is dispersed in the precursor of polyimide resin being kept unchanged, so as to provide significantly reduced dielectric constant and also provide improvement in mechanical strength and heat resistance, and the porous polyimide resin produced in the same producing method. A coating comprising porous polyimide resin is formed by applying resin solution comprising a precursor of polyimide resin and a dispersive compound and then drying a solvent, to form a coating in which the dispersive compound is dispersed in the precursor of polyimide resin; extracting the dispersive compound from the coating for removal to make the precursor of the polyimide resin porous; and imidizing the coating after preheated in a temperature range of 190–250° C.

5 Claims, 3 Drawing Sheets

Example 1

U.S. PATENT DOCUMENTS 6,426,372 B1 * 7/2002 Minami et al. ............... 521/63
6,696,529 B1 * 2/2004 Mochizuki et al. ......... 525/420

FOREIGN PATENT DOCUMENTS

| JP | 10-045936 | * | 2/1998 |
| JP | 2000-44719 | | 2/2000 |
| JP | 2001-81225 A | | 3/2001 |
| JP | 2002-124743 A | | 4/2002 |
| JP | 2002-146085 A | | 5/2002 |

* cited by examiner (a)

(b)

(c)

(d)

Example 1

Example 2

Comparative Example 1

METHOD FOR PRODUCING POROUS POLYIMIDE RESIN AND POROUS POLYMIDE RESIN

This application is a 35 U.S.C. 371 National Stage entry of PCT/JP02/06991, filed Jul. 10, 2002, which claims priority from Japanese Patent Application No. 2001-213274, filed Jul. 13, 2001, the contents of which are herein incorporated by reference to the extent allowed by law.

TECHNICAL FIELD

The present invention relates to a method of producing porous polyimide resin and to porous polyimide resin. More particularly, the present invention relates to a method of producing porous polyimide resin suitably used as insulating material for electronic/electric equipment and electronic components and to porous polyimide resin produced by the same producing method.

BACKGROUND ART

In general, polyimide resin has a high insulation performance. Accordingly, the polyimide resin is widely applied to electronic/electric equipment and electronic components including circuit boards and printed wiring boards as parts or components requiring high reliability.

In recent years, electronic equipment is increasingly demanded to store large amounts of information corresponding to the highly-networked information society, process them rapidly, and transmit them at high speed. Accordingly, the polyimide resin used in the electronic equipment is also demanded to have higher performance, particularly a reduction in dielectric constant and a reduction in dielectric loss tangent, for electric properties corresponding to higher frequencies.

An attempt to provide a reduction in the dielectric constant of polyimide resin was proposed, for example, by Japanese Laid-open (Unexamined) Patent Publication No. 2000-44719, according to which after hydrophilic polymer is dispersed in a precursor of polyimide resin soluble in an organic solvent, the hydrophilic polymer is removed by baking it or by extraction of the solvent, to form pores in the precursor of polyimide resin to thereby produce porous polyimide resin.

When the pores are formed in the precursor of polyimide resin by removing the hydrophilic polymer, it is ideal that the form of the microphase-separated structure wherein the hydrophilic polymer is dispersed in the precursor of polyimide resin is kept unchanged. However, when the pores are formed in the precursor of polyimide resin by removing hydrophilic polymer by baking it or by extraction of the solvent, followed by imidization of the precursor of polyimide resin, the pores are flattened or clogged, so that the porosity is reduced below the ideal one, resulting in a problem that sufficient reduction of the dielectric constant cannot be obtained.

Although it is preferable that the pores has a smaller diameter to retain mechanical strength and heat resistance of the porous polyimide resin produced, when the pores are reduced to a diameter as small as 1 μm or less, there arises the specific problem that the pores may be clogged with ease.

SUMMARY OF THE INVENTION

It is the object of the invention to provide a method of producing porous polyimide resin that enables pores to be formed in the precursor of polyimide resin, with the form of the microphase-separated structure wherein a dispersive compound is dispersed in the precursor of polyimide resin being kept unchanged, so as to provide sufficiently reduced dielectric constant and also provide good mechanical strength and heat resistance, and the porous polyimide resin produced by the same producing method.

The present invention provides a method of producing porous polyimide resin including preparing resin solution including a precursor of polyimide resin, a dispersive compound which disperses in the precursor of polyimide resin, and a solvent; forming a coating in which the dispersive compound is dispersed in the precursor of polyimide resin by application of the resin solution, followed by drying of the solvent; extracting the dispersive compound from the coating removed by an extracting solvent; preheating the coating in a temperature range of 190–250° C.; and imidizing the coating.

In this producing method, the coating is preferably heated in a temperature range of 270–400° C. in the imidizing method. Also, it is preferable that the dispersive compound is dispersed in the precursor of polyimide resin, with its average particle size of not more than 1 μm, in the coating forming method.

In this producing method, it is preferable that the dispersive compound has a weight-average molecular weight of not more than 10,000. Also, it is preferable that the extracting solvent used in the extracting and removing method is liquefied carbon dioxide or carbon dioxide that is in its super critical state.

In addition, the present invention includes a porous polyimide resin which is produced in a producing method including preparing resin solution including a precursor of polyimide resin, a dispersive compound which disperses in the precursor of polyimide resin, and a solvent; forming a coating in which the dispersive compound is dispersed in the precursor of polyimide resin by application of the resin solution, followed by drying of the solvent; extracting the dispersive compound from the coating removed by an extracting solvent; preheating the coating in a temperature range of 190–250° C.; and imidizing the coating, the resin which includes pores having an average pore size of not more than 1 μm. Further the porous polyimide resin preferably has a dielectric constant of not more than 3.

According to the porous polyimide resin producing method of the present invention, since the form of the pores (cells) in the precursor of polyimide resin obtained by extracting the dispersive compound for removal in the preheating method is retained, the form of the microphase-separated structure can be held as it is in the next imidizing method and accordingly the pores can be effectively prevented from being flattened or clogged. Due to this, even the similarly sized microscopic pores (cells) having an average pore size of e.g. 1 μm or less can be well formed without being clogged or closed and, as a result of this, the porous polyimide resin having a dielectric constant as low as not more than 3 or further not more than 2.5 can be obtained.

Accordingly, since the porous polyimide resin of the present invention can provide good high-frequency characteristics, mechanical strength, and heat resistance, the porous polyimide resin of the present invention can be effectively used as polyimide resins used in the electronic/electric equipment and the electronic components for storing large amounts of information, processing them rapidly, and transmitting them at high speed, including internal insulating material of the electronic equipment, cushioning material and an insulating layer of the circuit board.

DESCRIPTION OF THE INVENTION

Figure 1:
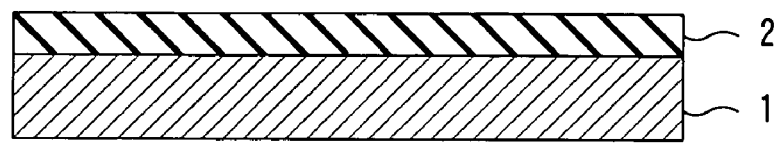
FIG. 1 illustrates a production method of an embodiment of a porous polyimide resin producing method of the present invention:
 (a) illustrates the method of applying resin solution to a substrate;
 (b) illustrates the method of drying the resin solution;
 (c) illustrates the method of extracting a dispersive compound from a precursor of polyimide resin for removal; and
 (d) illustrates the method of forming the porous polyimide resin by imidizing the precursor of polyimide resin.
Figure 1:
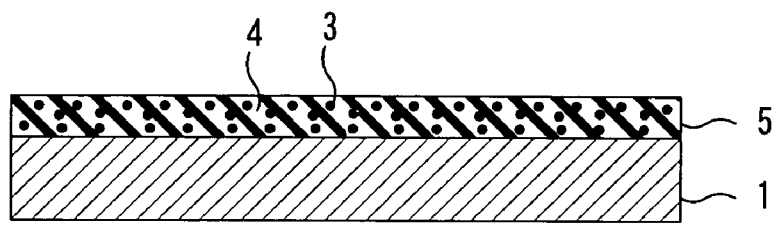
Figure 1:
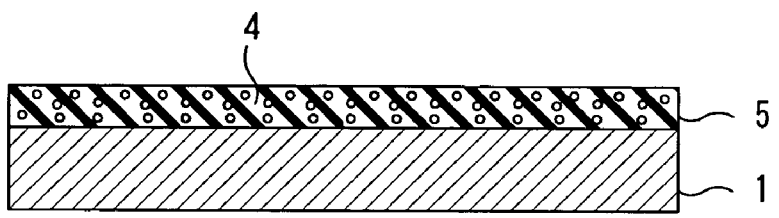
Figure 1:
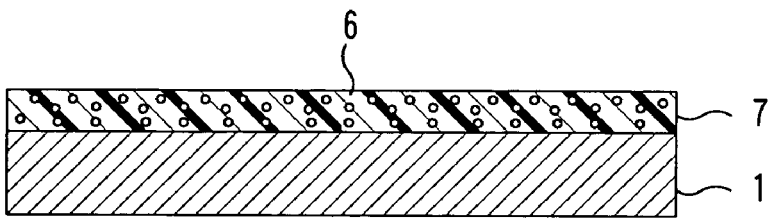

In the method of producing porous polyimide resin of the present invention, resin solution containing a precursor of polyimide resin, a dispersive compound capable of dispersing in the precursor of polyimide resin, and a solvent is first prepared in the resin solution preparing method.

The precursor of polyimide resin used in the present invention is the precursor of polyimide resin from which polyimide resin can be formed by imidization. Known precursors, such as polyamic acid resin, can be used without any particular limitation.

The polyamic acid resin can be produced, for example, by reacting organic tetracarboxylic dianhydride with diamine. The organic tetracarboxylic dianhydrides that may be used include, for example, pyromelletic dianhydride, 3,3',4,4'-biphenyltetracarboxylic dianhydride, 2,2-bis(2,3-dicarboxyphenyl)-1,1,1,3,3,3-hexafluoropropane dianhydride, 2,2-bis(3,4-dicarboxyphenyl)-1,1,1,3,3,3-hexafluoropropane dianhydride, 3,3',4,4'-benzophenonetetracarboxylic dianhydride, bis(3,4-dicarboxyphenyl)-ether dianhydride, and bis(3,4-dicarboxyphenyl)-sulfonic dianhydride. Those may be used singly or in combination of two or more.

The diamines that may be used include, for example, m-phenylenediamine, p-phenylenediamine, 3,4'-diaminodiphenyl ether, 4,4'-diaminodiphenyl ether, 4,4'-diaminodiphenyl sulfone, 3,3'-diaminodiphenyl sulfone, 2,2-bis(4-aminophenoxyphenyl)propane, 2,2-bis(4-aminophenoxyphenyl)hexafluoropropane, 1,3-bis(4-aminophenoxy)benzene, 1,4-bis(4-aminophenoxy)benzene, 2,4-diaminotoluene, 2,6-diaminotoluene, diaminodiphenylmethane, 4,4'-diamino-2,2-dimethylbiphenyl, and 2,2-bis(trifluoromethyl)-4,4'-diaminobiphenyl. Those may be used singly or in combination of two or more.

The polyamic acid resin can be produced in the form of solution of polyamic acid resin, for example, by reacting organic tetracarboxylic dianhydride with diamine in such a ratio as to be a substantially equimolar ratio in a suitable organic solvent like a polar solvent, such as N-methyl-2-pyrrolidone, N,N-dimethylacetamide, N,N-dimethylformamide, and dimethylsulfoxide, usually at 0–90° C. for 1–24 hours.

The polyamic acid resin thus produced has a unit structure expressed by the following general formula (1) and has a weight-average molecular weight in the approximate range of 5,000–200,000, or preferably 10,000–100,000.

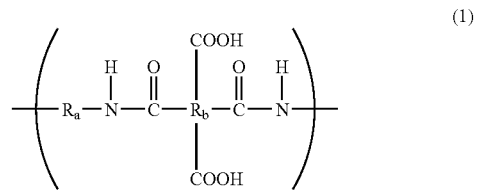

(1)

(where $R_a$ represents a bivalent organic group and $R_b$ represents a quadrivalent organic group).

In addition to the polyamic acid resin mentioned above, for example polyamic acid resin having carboxyl groups to be bonded to $R_b$ of the general formula (1) given above, either or both of the carboxyl groups being esterified by a compound having hydroxyl group, can also be cited as the precursor of polyimide resin. It is preferable that any of the precursors of the polyimide resins are prepared in the form of solution of reactive solvent.

Any dispersive compounds that can be mixed and dispersed in the precursor of polyimide resin and extracted for removal therefrom by using an extracting solvent, as mentioned later, may be used to the present invention without any particular limitation. To be more specific, the dispersive compounds that may be microphase-separated into the fine-grained form in the precursor of polyimide resin can preferably be used. For example, polyethylene glycol, polypropylene glycol and their derivatives capped with methyl at half-end or both-end thereof, or, their derivatives capped with (metha) acrylate at half-end or both-end thereof, urethane prepolymer, phenoxypolyethylene glycol (metha) acrylate, ε-caprolactone (metha) acrylate, trimethylolpropane tri (metha) acrylate, dipentaerithritol hexa (metha) acrylate, urethane (metha) acrylate, epoxy (metha) acrylate, and oligoester (metha) acrylate can be cited as the dispersive compound. Those dispersive compounds may be used singly or in combination of two or more.

The dispersive compound usually has an average particle diameter of 0.05–3 μm, or preferably 0.05–1 μm. In order to form the microphase-separated structure having a pore size (cell size) of not more than 1 μm in the precursor of polyimide resin in the next coating forming process, the dispersive compound preferably has a weight-average molecular weight of not more than 10,000, usually in the range of 100–3,000, or preferably in the range of 250–1,500. When the weight-average molecular weight of the dispersive compound is in excess of 10,000, compatibility of the dispersive compound with the precursor of polyimide resin may reduce so that the phase-separated structure formed may increase.

The amount of dispersive compound mixed is suitably determined, taking the weight-average molecular weight of the dispersive compound and others into consideration. For example, in order to form the microphase-separated structure having the cell size of not more than 1 μm in the precursor of polyimide resin, not more than 200 parts by weight of dispersive compound per 100 parts by weight of precursor of polyimide resin is preferably mixed. Also, in order to provide the void content required for the porous polyimide resin obtained to have the dielectric constant of not more than 3, at least 10 parts by weight of dispersive compound per 100 parts by weight of precursor of polyimide resin is preferably mixed.

The reactive solvent used to synthesize the precursor of polyimide resin may be used as it is in the present invention. Further, in addition to or in place of the reactive solvent, organic solvent, such as 1,3-dimethyl-2-imidazolidinone, diglyme, triglyme, tetrahydrofuran, dioxane, cyclohexane, toluene, and xylene, may be used singly or in combination of two or more.

Although no particular limitation is imposed on the amount of solvent mixed, the amount of solvent mixed is adjusted to adjust the viscosity of resin solution for the intended purpose and application. Usually, the solvent is mixed in a weight ratio of the same quantity to 100 times, or preferably 2 times to 50 times as much as the total amount of precursor of polyimide resin and dispersive compound.

In the resin solution preparing method, the precursor of polyimide resin, the dispersive compound and the solvent may be properly mixed in the ratio mentioned above in a known method, to prepare the resin solution. Specifically, when the reactive solvent used to synthesize the precursor of polyimide resin is used as it is, the dispersive compound may be blended directly in the solvent in which the precursor of polyimide resin is dissolved in the ratio mentioned above, followed by being mixed therewith, under stirring.

Sequentially, in the coating forming method of the porous polyimide resin producing method of the present invention, after the application of the resin solution, the solvent is dried to form the coating in which the dispersive compound is dispersed in the precursor of polyimide resin.

For example, the resin solution may be applied as shown in FIG. 1(a). That is to say, a specified substrate 1 is prepared and the resin solution 2 is applied to the substrate 1.

The materials that may be used for the substrate 1 include, for example, foils or sheets of metals or alloys thereof, such as copper, aluminum, stainless, copper-beryllium, phosphor bronze, and iron-nickel, foils or sheets of ceramics, such as silicon wafer, and glass, and films of plastics, such as polyimide and polyester.

The substrate may be coated with the resin solution in any adequate known coating method, such as a spin coater and a bar coater, in accordance with the form of the substrate and the thickness of the coating. It is preferable that the resin solution is applied so that the coating after being dried may have thickness of 0.1–50 μm, or preferably 1–25 μm.

Before the application of the resin solution, the first coat of silane coupling agent or titanate coupling agent may be given to the surface of the substrate to provide improvement in adhesion.

The solvent may be dried by heating at 40–200° C. in usual, or preferably 60–190° C., though it depends on the types of solvent. The drying time is usually in the range of 1–30 minutes, though it depends on the heating temperature. As the result of this drying of the solvent, the dispersive compound 3 is insolubilized in the precursor 4 of polyimide resin and is microphase-separated in the form of microscopic particles and, as a result, the coating 5 in which the dispersive compound 3 is uniformly dispersed in the precursor 4 of polyimide resin is formed, as model-wisely shown in FIG. 1(b).

It is preferable that the dispersive compound is dispersed so that the microphase-separated structure having a pore size (cell size) of not more than 1 μm can be formed in the precursor of polyimide, in order to provide reduction in dielectric constant, as mentioned above.

The solvent may be dried at one-time drying or may be dried at two or more times by changing temperature stepwise.

In the porous polyimide resin producing method of the present invention, the dispersive compound is extracted for removal from the coating in which the dispersive compound is dispersed in the precursor of polyimide resin by using the extracting solvent in the extracting and removing method.

No particular limitation is imposed on the extracting solvent. Organic solvent usually used as the extracting solvent may be used in the present invention. From the viewpoints of removal efficiency and harmlessness, liquefied carbon dioxide or carbon dioxide that is in its super critical state (supercritical carbon dioxide) is preferably used.

For example, when the supercritical carbon dioxide is used, the extracting temperature is just required to be equal to or higher than the critical point, as well as in the range in which the precursor of polyimide resin is not imidized extremely in the extracting and removing method. In practice, since solubility of the dispersive compound in the supercritical carbon dioxide reduces with an increase in the temperature, the extracting temperature is preferably in the range of 32–180° C., or preferably 40–150° C. Also, the extracting pressure is just required to be equal to or higher than the critical point. To be more specific, the extracting pressure is preferably in the range of 7.3–100 Mpa, or preferably 10–50 Mpa. Further, the extracting time is usually in the approximate range of 1–30 hours, though it depends on the extracting temperature, the extracting pressure, or the amount of dispersive compound mixed which is dispersed in the precursor of polyimide resin.

No particular limitation is imposed on the extracting method. For example, after the critical carbon dioxide is pressurized, it may be fed continuously into a pressure vessel containing the coating by using a metering pump. Alternatively, the supercritical carbon dioxide pressurized to a specified pressure may be fed into the pressure vessel containing the coating.

As a result of this, the dispersive compound 3 is extracted and removed from the precursor 4 of polyimide resin and thereby the porous coating 5 is formed, as shown in FIG. 1(c).

Sequentially, in the porous polyimide resin producing method of the present invention, the porous coating of the precursor of polyimide resin is preheated in the temperature range of 190–250° C. in the preheating method.

The coating may be preheated in a known manner. The preheating can allow the precursor of polyimide resin to be imidized to a moderate degree. Due to this, even when the coating is imidized in the next imidizing process, the pores (cells) are held (fixed) in their forms, so that they are prevented from being flattened or clogged in the imidizing process. The preheating time is usually in the range of 1–40 hours, or preferably 2–24 hours, though it depends on the preheating temperature.

Then, in the porous polyimide resin producing method of the present invention, the coating is imidized in the imidizing process to obtain the porous polyimide resin.

The coating may be imidized by heating in a known manner. For example, the coating is usually heated in the temperature range of 270–400° C. for a few hours in a vacuum or in an atmosphere of an inert gas. As a result of this, the heating/dehydration/ring-closure reaction of the precursor of polyimide resin is carried out. As a result of this, the coating 5 comprising the precursor 4 of the polyimide resin as was made porous is imidized to form a coating 7 comprising the porous polyimide resin 6, as shown in FIG. 1(*d*).

The precursor of polyimide resin as was made porous may be imidized under the action of dehydration cyclization agent, such as the mixture of acetic anhydride and pyridine, in the imidizing process.

According to the porous polyimide resin producing method of the present invention, since the form of the pores (cells) in the precursor of polyimide resin obtained by extracting the dispersive compound for removal in the preheating process is retained, the form of the microphase-separated structure can be held as it is in the next imidizing method and accordingly the pores can be effectively prevented from being flattened or clogged. Due to this, even the similarly sized microscopic pores (cells) having an average pore size of e.g. 1 μm or less can be well formed without being clogged or closed and, as a result of this, the porous polyimide resin having a dielectric constant as low as not more than 3 or not further than 2.5 can be obtained.

Accordingly, since the porous polyimide resin of the present invention can provide good high-frequency characteristics, mechanical strength, and heat resistance, the porous polyimide resin of the present invention can be effectively used as polyimide resins used in the electronic/electric equipment and the electronic components for storing large amounts of information, processing them rapidly, and transmitting them at high speed, including internal insulating material of the electronic equipment, cushioning material and an insulating layer of the circuit board.

In the present invention, known sensitizers, such as derivative of dihydropyridine, derivative of diazonaphthoquinone ester sulfonate, and aromatic diazide compound, may be blended suitably, for example, in the resin solution preparing method so that the formed coating may be patterned in a specific form by exposing it to light for development in a known manner in any desirable method after the coating forming method (for example, in the method between the extracting and removing method and the imidizing method).

EXAMPLES

While in the following, the present invention will be described in further detail with reference to Examples and Comparative Example, the present invention is not limited to any of Examples and Comparative Example.

Synthesizing Example 1

After 10.8 g of p-phenylenediamine was poured in a 500 mL separable flask having an agitator and a temperature gauge, 247.2 g of N-methyl-2-pyrrolidone (NMP) was added thereto and stirred to dissolve the p-phenylenediamine.

Then, 29.4 g of 3,3',4,4'-biphenyltetracarboxylic dianhydride was gradually added to the solution and was stirred continuously at temperature of not higher than 30° C. for two hours, to obtain the solution of the precursor of polyimide resin having the concentration of 14 weight percent.

Synthesizing Example 2

After 29.2 g of 1,4-bis(4-aminophenoxy)benzene was poured in a 500 mL separable flask having an agitator and a temperature gauge, 360.3 g of N-methyl-2-pyrrolidone (NMP) was added thereto and stirred to dissolve the 1,4-bis(4-aminophenoxy)benzene.

Then, 29.4 g of 3,3',4,4'-biphenyltetracarboxylic dianhydride was gradually added to the solution and was stirred continuously at temperature of not higher than 30° C. for two hours, to obtain the solution of the precursor of polyimide resin having the concentration of 14 weight percent.

Example 1

30 parts by weight of the solution of the precursor of polyimide resin obtained in the synthesizing example 2 was mixed with 70 parts by weight of the solution of the precursor of polyimide resin obtained in the synthesizing example 1, to obtain the mixed solution of the precursor of polyimide resin. Then, polyethylene glycol dimethylether having the weight-average molecular weight of 500 was blended in the mixed solution of the precursor of polyimide resin in the proportion of 66 parts by weight per 100 parts by weight of resin contents in the mixed solution of the precursor of polyimide resin and was stirred, to obtain transparent homogeneous resin solution.

Then, the resin solution thus obtained was applied to a stainless foil (SUS304) having thickness of 25 μm by using the spin coater so that the coating could have thickness of 21 μm after dried. Then, the resin solution was dried at 95° C. for ten minutes in a hot-air circulation oven to release NMP therefrom. Thereafter, the resin solution was dried further at 180° C. for twenty minutes in the hot-air circulation oven to be completely dried and thereby the coating comprising the precursor of polyimide resin having the microphase-separated structure of polyethylene glycol dimethylether was formed.

Sequentially, after the coating thus obtained was cut to a 100 mm×60 mm sheet, the sheet was put in the 500 mL pressure vessel. After an interior of the pressure vessel was pressurized to 25 MPa in an atmosphere of 100° C., the carbon dioxide was fed in the pressure vessel at a flow rate of about 5 L per minute by gas volume while keeping that pressure and discharged therefrom, to carry out the operations to extract the polyethylene glycol dimethylether for two hours.

Sequentially, the coating was preheated at 250° C. for 24 hours so that the form of the pores (cells) in the precursor of polyimide resin produced by extracting the polyethylene glycol dimethylether for removal from the precursor of polyimide resin could be retained (fixed).

Thereafter, the coating was heated at 375° C. for two hours in a vacuum of 1.3 Pa, to form the coating comprising the polyimide resin.

Figure 2:
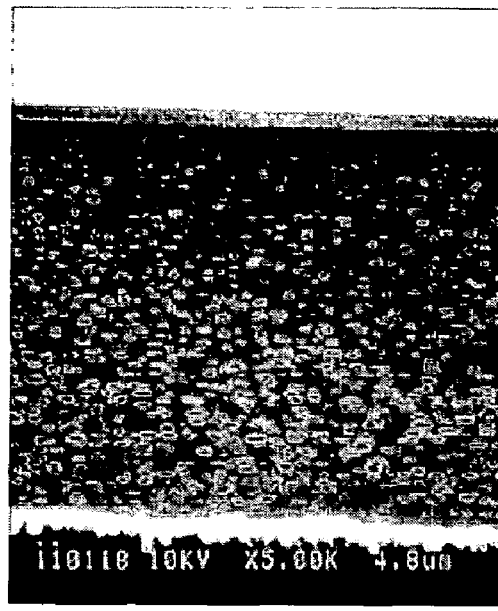
FIG. 2 is a photograph taken with a scanning electron microscope, showing a sectional view of a coating comprising porous polyimide resin of Example 1.

The SEM observation image of a sectional view of the coating comprising the porous polyimide resin obtained was made by the image processing. The result is shown in FIG. 2. The size of the pores (cells) calculated by the image processing was 0.193 μm. Also, the dielectric constant ($\epsilon$) of the coating comprising the porous polyimide resin obtained was 2.539 (measuring frequency: 1 MHz). The measuring method (the same measuring methods were used in the sequent Example and Comparative Example) is described below.

SEM Observation: The coating film comprising the porous polyimide resin was cut at an accelerating voltage of 30 kV and a beam voltage of 0.8 μA by using focused ion beam processing equipment (FIB) (SMI9200 available from Seiko Instruments, Inc.) and using liquid metal Ga as the ion source. The sectional view of the coating was observed with the scanning electron microscope (SEM) (S-570 available from Hitachi, Ltd.) at an accelerating voltage of 10 kV.

Dielectric Constant: The dielectric constant of the coating was measured with HP4284A Precision LCR Meter available from Yokokawa Hewlett-Packard Co.

Example 2

Except that polyethylene glycol dimethylether having the weight-average molecular weight of 500 was blended in the mixed solution of the precursor of polyimide resin in the proportion of 80 parts by weight per 100 parts by weight of resin contents in the mixed solution of the precursor of polyimide resin, to prepare the resin solution, the same operations as the operations of Example 1 were made to form the coating comprising the porous polyimide resin.

Figure 3:
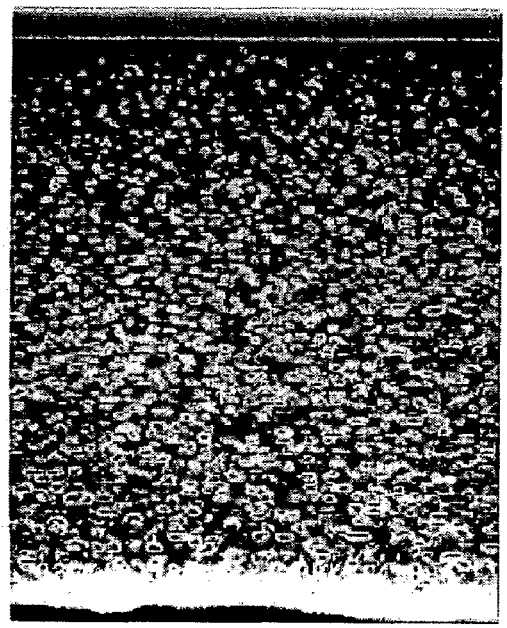
FIG. 3 is a photograph taken with the scanning electron microscope, showing a sectional view of a coating comprising porous polyimide resin of Example 2.

The SEM observation image of a sectional view of the coating comprising the porous polyimide resin obtained was made by the image processing. The result is shown in FIG. 3. The size of the pores (cells) calculated by the image processing was 0.194 μm. Also, the dielectric constant ($\epsilon$) of the coating obtained was 2.200 (measuring frequency: 1 MHz).

Comparative Example 1

Except that the coating was not preheated at 250° C. for 24 hours, the same operations as the operations of Example 1 were made to form the coating comprising the porous polyimide resin.

The SEM observation image of a sectional view of the coating comprising the porous polyimide resin obtained was made by the image processing. The result is shown in FIG. 4.

Figure 4:
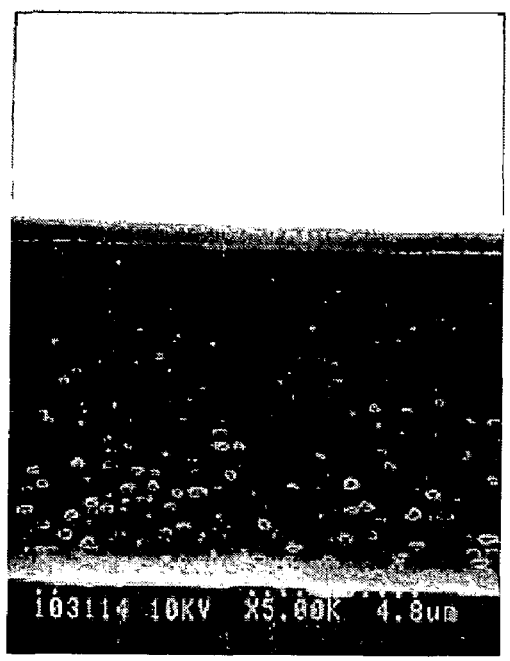
FIG. 4 is a photograph taken with the scanning electron microscope, showing a sectional view of a coating comprising porous polyimide resin of Comparative Example 1.

Though the size of the pores (cells) in the coating calculated by the image processing was 0.199 μm, the pores were clogged, as seen from FIG. 4. Hence, Comparative Example 1 has a reduced number of pores, as compared with Examples 1 and 2, for the reason of which the dielectric constant ($\epsilon$) of the coating was 3.04 (measuring frequency: 1 MHz).

While the illustrative embodiments of the present invention are provided in the above description, such is for illustrative purpose only and it is not to be construed restrictively. Modification and variation of the present invention that will be obvious to those skilled in the art is to be covered by the following claims.

The porous polyimide resin of the present invention produced in the porous polyimide resin producing method of the present invention can be effectively used as polyimide resins used in the electronic/electric equipment and the electronic components for storing large amounts of information, processing them rapidly, and transmitting them at high speed, including internal insulating material of the electronic equipment, cushioning material and an insulating layer of the circuit board.

The invention claimed is:

1. A method of producing porous polyimide resin comprising the following steps:
   preparing resin solution comprising a precursor of polyimide resin, a dispersive compound which disperses in the precursor of polyimide resin, and a first solvent;
   forming a coating in which the dispersive compound is dispersed in the precursor of polyimide resin by application of the resin solution, followed by drying of the first solvent;
   extracting the dispersive compound from the coating by use of a second, extracting solvent after the coating step;
   preheating the coating in a temperature range of 190–250° C. after the extracting step; and
   imidizing the coating.

2. The method of producing porous polyimide resin according to claim 1, wherein the coating is heated in a temperature range of 270–400° C. in the imidizing step.

3. The method of producing porous polyimide resin according to claim 1, wherein the dispersive compound is dispersed in the precursor of polyimide resin, with an average particle size of the dispursive compound being not more than 1 μm, in the coating forming step.

4. The method of producing porous polyimide resin according to claim 1, wherein the dispersive compound has a weight-average molecular weight of not more than 10,000.

5. The method of producing porous polyimide resin according to claim 1, wherein the second, extracting solvent used in the extracting step is one of liquefied carbon dioxide and carbon dioxide that is in its super critical state.

* * * * *